(12) United States Patent
Kim et al.

(10) Patent No.: US 7,161,407 B2
(45) Date of Patent: Jan. 9, 2007

(54) FUSE CIRCUIT WITH CONTROLLED FUSE BURN OUT AND METHOD THEREOF

(75) Inventors: Jong-Hoon Kim, Suwon-si (KR); Sang-Seok Kang, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 139 days.

(21) Appl. No.: 10/968,171

(22) Filed: Oct. 20, 2004

(65) Prior Publication Data

US 2005/0122159 A1    Jun. 9, 2005

(30) Foreign Application Priority Data

Dec. 9, 2003    (KR) .................. 10-2003-0089049

(51) Int. Cl.
*H01H 37/76* (2006.01)

(52) U.S. Cl. ..................................... 327/525; 327/333

(58) Field of Classification Search ................ 327/318, 327/319, 333, 525
See application file for complete search history.

(56) References Cited

U.S. PATENT DOCUMENTS

| | | | |
|---|---|---|---|
| 4,695,744 A * | 9/1987 | Giordano .................... | 327/333 |
| 5,448,187 A * | 9/1995 | Kowalski ..................... | 326/81 |
| 6,373,315 B1 * | 4/2002 | Tsuji et al. .................. | 327/333 |
| 6,404,264 B1 * | 6/2002 | Daniel et al. ................ | 327/407 |
| 6,498,526 B1 | 12/2002 | Lim et al. | |
| 6,552,960 B1 | 4/2003 | Shirai et al. | |
| 6,724,238 B1 * | 4/2004 | Derner et al. ................ | 327/525 |
| 6,791,392 B1 * | 9/2004 | Maejima et al. ............. | 327/333 |
| 6,949,952 B1 * | 9/2005 | Mecier et al. ................ | 326/38 |

FOREIGN PATENT DOCUMENTS

| | | |
|---|---|---|
| KR | 2000-0050451 | 8/2000 |
| KR | 10-0386643 | 9/2001 |
| KR | 2002-0053769 | 7/2002 |

* cited by examiner

*Primary Examiner*—Jeffrey Zweizig
(74) *Attorney, Agent, or Firm*—Harness, Dickey & Pierce P.L.C.

(57) ABSTRACT

A fuse arrangement in a semiconductor device, including a fuse resistor being connected to a first voltage, and a transistor passing current to the fuse resistor, wherein a second voltage is applied to a gate of the transistor, the second voltage being greater than the first voltage. Another fuse arrangement in a semiconductor device, including a first fuse resistor having a first terminal connected to a first voltage and a second terminal connected to a first node, a second fuse resistor having a third terminal connected to the first voltage and a fourth terminal connected to a second node, and a transistor being controlled by a first signal with a second voltage, the transistor passing current to the second terminal of the first fuse resistor based on the first signal, the second voltage being greater than the first voltage. A method of burning out a fuse resistor in a fuse arrangement, including converting a received first signal with a first voltage level to a second signal with a second voltage level, the second voltage level being greater than the first voltage level, and applying the second signal to the fuse resistor.

19 Claims, 6 Drawing Sheets

FUSE CIRCUIT WITH CONTROLLED FUSE BURN OUT AND METHOD THEREOF

CROSS-REFERENCE TO RELATED APPLICATIONS

This U.S. non-provisional patent application claims priority under 35 U.S.C. § 119 of Korean Patent Application 2003-89049 filed on Dec. 9, 2003, the entire contents of which are hereby incorporated by reference.

BACKGROUND OF THE INVENTION

As semiconductor devices become more integrated and/or increase their storage capacity, there may be an increased risk of memory defects in memory cells of semiconductor devices. A yield of semiconductor devices may be reduced when increasing numbers of semiconductor devices have memory defects. By conventional methods, a semiconductor device with a single memory defect may be determined to be a production failure, thereby lowering the yield of the semiconductor device.

Various methods of improving the yield of semiconductor devices have been proposed. For example, a redundancy technique including a fuse circuit is a conventional method for increasing the yield of semiconductor devices.

Redundancy techniques have been widely used in the conventional art. Redundancy techniques may be employed by replacing a memory cell including a memory defect with a memory cell without the memory defect.

By the conventional art, there may be two methods of employing redundancy techniques.

In the first conventional method, a fuse may be cut with a laser device.

In the second conventional method, an electric current may flow into the fuse so that the fuse may exceed an electric current threshold and burn out. The second conventional method may be referred to as an Electric Fuse (E-Fuse) method.

By the conventional art, the E-Fuse method may only be used after an assembly of a semiconductor chip package has been completed. With the E-Fuse method, it may be possible to replace a memory cell with a memory defect with a memory cell without a defect only after complete assembly of the semiconductor chip package.

FIG. 1 illustrates a conventional fuse circuit 100.

Referring to FIG. 1, the conventional fuse circuit 100 may include a first fuse resistor R1 and a second fuse resistor R2. The fuse resistors R1 and R2 may have different resistances. As shown, a PMOS transistor P1 may include a source and a drain. The source of PMOS transistor P1 may be connected to a terminal of the fuse resistor R1, and the drain of the PMOS transistor P1 may be connected to a node A. A PMOS transistor P2 may include a gate which may be connected to the node A. The PMOS transistor P2 may also include a source and a drain. The source of the PMOS transistor P2 may be connected to the fuse resistor R2, and the drain of the PMOS transistor P2 may be connected to a node B. A gate of the PMOS transistor P1 may be connected to the node B. A NMOS transistor N1 may include a drain which may be connected to the node A. The NMOS transistor N1 may also include a source which may be connected to a ground terminal GND. The NMOS transistor N1 may further include a gate which may be connected to the node B. A NMOS transistor N2 may include a gate, a drain and a source. The gate, the drain, and the source of NMOS transistor N2 may be connected to the node A, the node B and the ground terminal GND, respectively.

However, the above-described E-Fuse method may not be completely accurate, thereby making it be difficult to verify whether the E-Fuse method successfully burns out an appropriate fuse.

SUMMARY OF THE INVENTION

An exemplary embodiment of the present invention is a fuse arrangement in a semiconductor device, including a fuse resistor being connected to a first voltage, and a transistor passing current to the fuse resistor, wherein a second voltage is applied to a gate of the transistor, the second voltage being greater than the first voltage.

Another exemplary embodiment of the present invention is a fuse arrangement in a semiconductor device, including a first fuse resistor having a first terminal connected to a first voltage and a second terminal connected to a first node, a second fuse resistor having a third terminal connected to the first voltage and a fourth terminal connected to a second node, and a transistor being controlled by a first signal with a second voltage, the transistor passing current to the second terminal of the first fuse resistor based on the first signal, the second voltage being greater than the first voltage.

Another exemplary embodiment of the present invention is a method of burning out a fuse resistor in a fuse arrangement, including converting a received first signal with a first voltage level to a second signal with a second voltage level, the second voltage level being greater than the first voltage level, and applying the second signal to the fuse resistor.

BRIEF DESCRIPTION OF THE DRAWINGS

The present invention will become more apparent by describing in detail exemplary embodiments thereof with reference to the attached drawings in which.

DETAILED DESCRIPTION OF EXEMPLARY EMBODIMENTS

Figure 1:
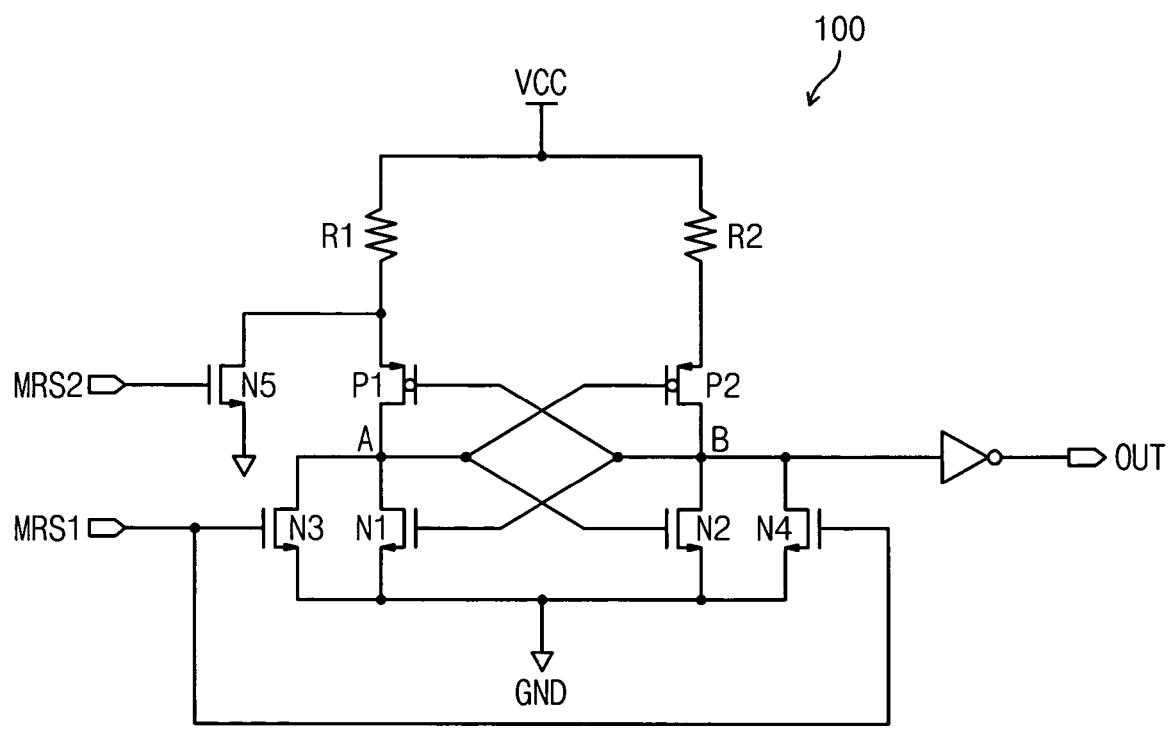
FIG. 1 illustrates a conventional fuse circuit.

Hereinafter, exemplary embodiments of the present invention will be described in detail with reference to the accompanying drawings.

In the Figures, the same reference numerals may be used to denote the same elements throughout the drawings.

Figure 2A:
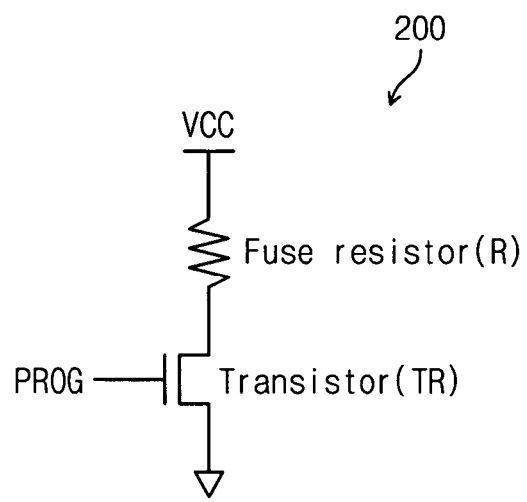
FIG. 2A illustrates a fuse circuit according to an exemplary embodiment of the present invention.

FIG. 2A illustrates a fuse circuit 200 according to an exemplary embodiment of the present invention.

In an exemplary embodiment of the present invention, referring to FIG. 2A, the fuse circuit 200 may include a fuse resistor R and a transistor TR.

In an exemplary embodiment of the present invention, referring to FIG. 2A, it may be necessary to increase an electric current flowing through transistor TR in order for the electric current to flow into the fuse resistor R, thereby burning out fuse resistor R. Exemplary embodiments of methods for increasing the electric current will now be described with reference to the fuse circuit 200 of FIG. 2A.

In an exemplary embodiment of the present invention, referring to FIG. 2A, the electric current in fuse resistor R may be increased by increasing a gate voltage of the transistor TR. The gate voltage of transistor TR is represented in FIG. 2A by program signal PROG.

In another exemplary embodiment of the present invention, referring to FIG. 2A, the electric current in fuse resistor R may be increased by increasing a voltage level of a power voltage VCC of the fuse circuit 200.

Figure 2B:
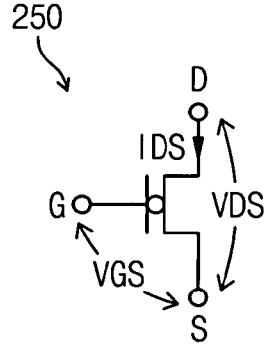
FIG. 2B illustrates a transistor according to an exemplary embodiment of the present invention.

FIG. 2B illustrates a transistor 250 according to an exemplary embodiment of the present invention.

Figure 2C:
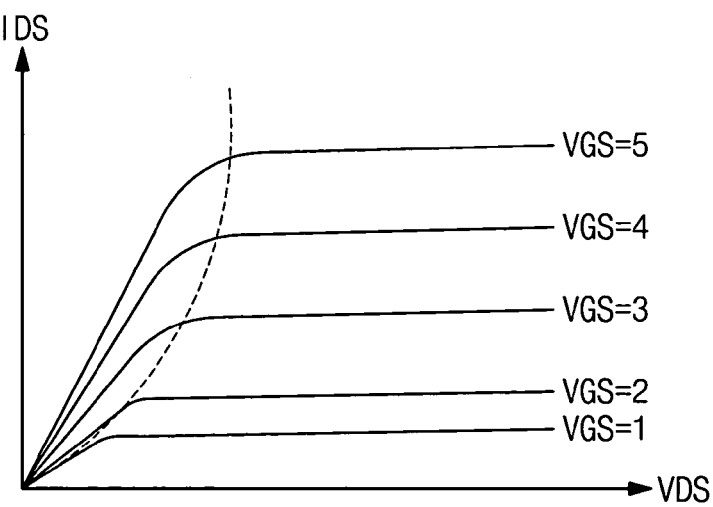
FIG. 2C illustrates a graph showing characteristics of a current and a voltage of the transistor of FIG. 2B according to an exemplary embodiment of the present invention.

FIG. 2C illustrates a graph showing characteristics of a current and a voltage of the transistor of FIG. 2B according to an exemplary embodiment of the present invention.

In an example of an exemplary embodiment of the present invention, it may be assumed that a transistor is operated in a saturation region. It may further be assumed that an IDS may be a current between a drain and a source of the transistor, for example the transistor 250 of FIG. 2B. The IDS may depend on a voltage VGS, the VGS being a voltage between a gate G and a source S of the transistor 250. As shown in FIG. 2C, IDS may increase with an increased voltage level of the VGS. If the source S of transistor 250 of FIG. 2B is connected to a ground terminal, the VGS may be applied to a gate of the transistor 250.

In another exemplary embodiment of the present invention, referring to FIG. 2A, a gate voltage (i.e. program signal PROG) of the transistor TR may be increased, which may increase the current in the transistor TR. Thus, the current in the fuse resistor R may be increased by increasing the current in the transistor TR.

The variation of the IDS will now be described with the assumption that the gate voltage (i.e. program signal PROG) is constant according to another exemplary embodiment of the present invention.

In an exemplary embodiment of the present invention, when the gate voltage VGS is constant, the IDS may vary in the saturation region. As shown in FIG. 2C, if the gate voltage VGS is constant, IDS response curves may not horizontal, but rather may be inclined. In addition, a variable of the x-coordinate is a VDS, the VDS being a voltage between the drain and source of the transistor. As the VDS increases, currents passing through the transistor may also increase. However, the IDS may increase or decrease slowly in response to increases and/or decreases of the VDS and/or VGS. If the source is connected to the ground terminal, the VGS may be applied to the gate of the transistor.

Thus, current passing through the transistor TR may be increased by increasing the power voltage VCC of the fuse circuit 200, the power voltage VCC being applied to the drain of the transistor TR.

In another exemplary embodiment of the present invention, the fuse circuit 200 may be burnt out by increasing current flowing to the fuse resistor R, the fuse resistor R being connected to the transistor TR.

Figure 3:
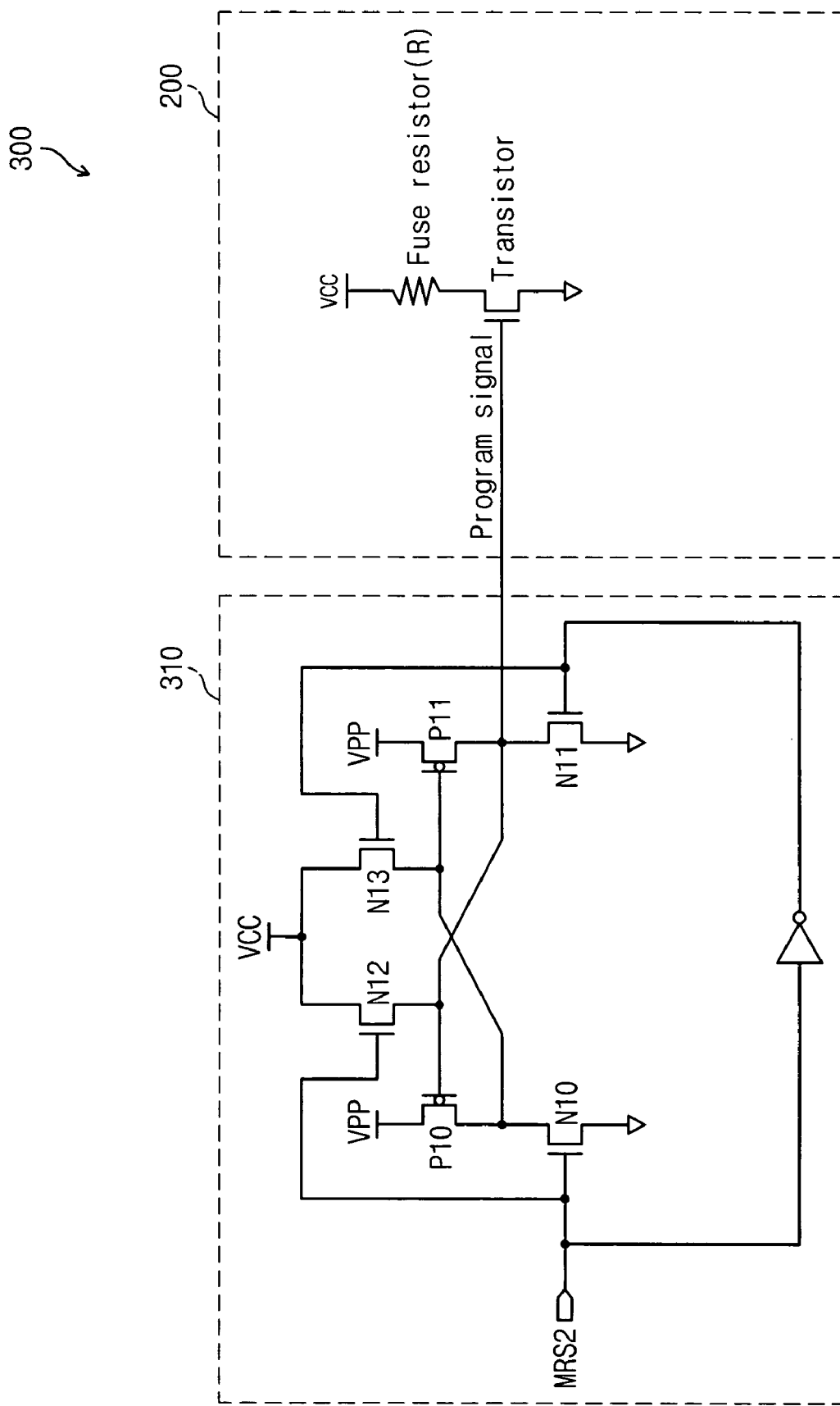
FIG. 3 illustrates a circuit construction diagram of a fuse circuit including the fuse circuit of FIG. 2A according to another exemplary embodiment of the present invention.

FIG. 3 illustrates a circuit construction diagram of a fuse arrangement 300, including the fuse circuit 200 of FIG. 2A, according to another exemplary embodiment of the present invention.

In another exemplary embodiment of the present invention, referring to FIG. 3, the fuse arrangement 300 may apply a signal from a level shift circuit 310 to a gate of a transistor TR of the fuse circuit 200.

In another exemplary embodiment of the present invention, referring to FIG. 3, the level shift circuit 310 may include a booster voltage VPP. The booster voltage VPP may be used to supply power to the fuse circuit 200. The booster voltage VPP may be greater than the power voltage VCC.

In another exemplary embodiment of the present invention, the level shift circuit 310 may receive a first signal with a voltage level of the power voltage VCC. The level shift circuit 310 may change the first signal into a second signal with a voltage level of the booster voltage VPP. The second signal may be output to a gate of the transistor TR.

In another exemplary embodiment of the present invention, the voltage level of the second signal may be greater than the power voltage VCC.

Figure 4:
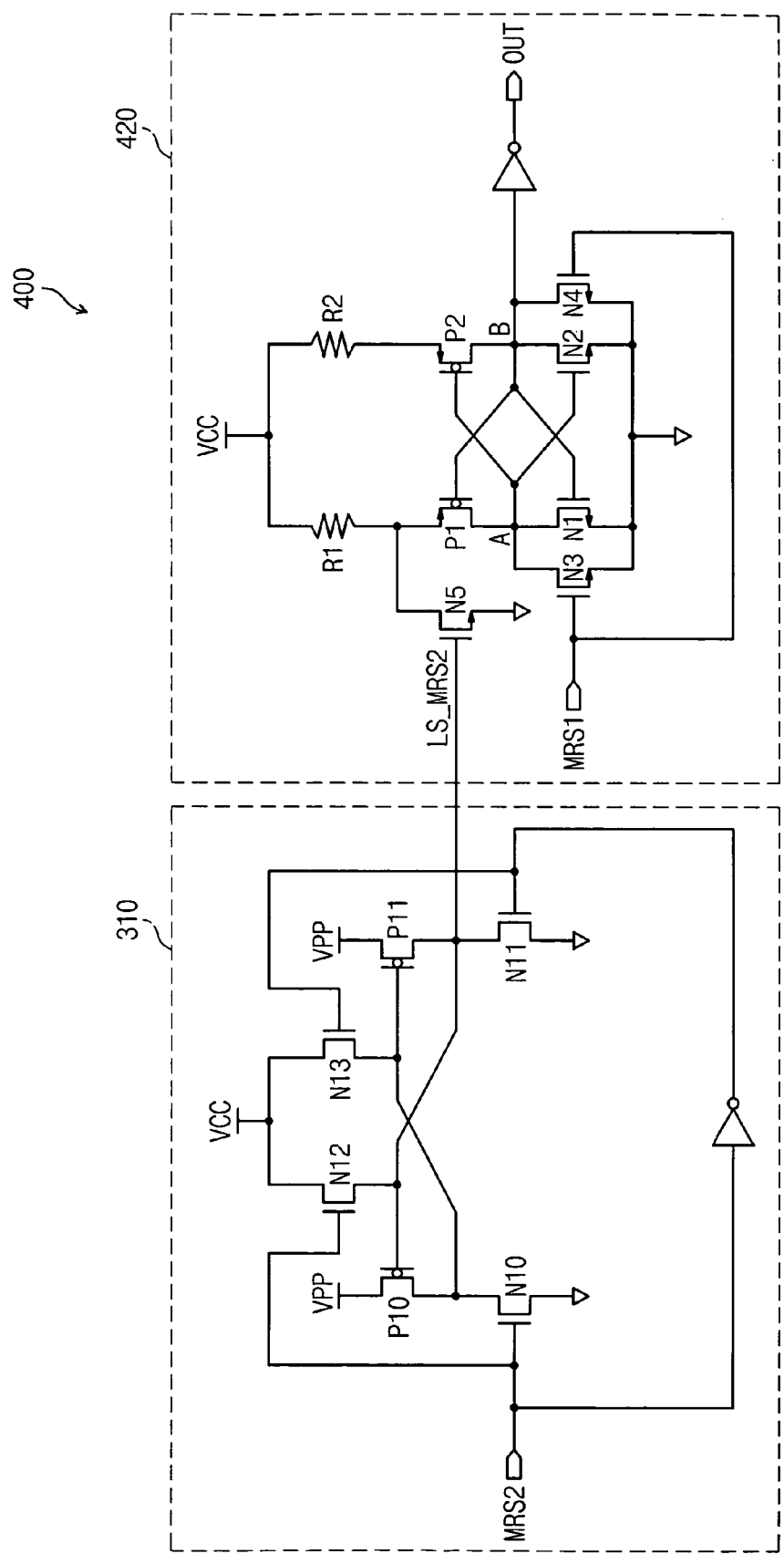
FIG. 4 illustrates a construction of a fuse circuit according to another exemplary embodiment of the present invention.

FIG. 4 illustrates a construction of a fuse arrangement 400 according to another exemplary embodiment of the present invention.

In another exemplary embodiment of the present invention, referring to FIG. 4, the fuse arrangement 400 may include the level shift circuit 310 of FIG. 3 and a fuse circuit 420.

In another exemplary embodiment of the present invention, the fuse circuit 420 may function similar to the fuse circuit 100 of FIG. 1. Thus, the function of fuse circuit 420 will not be described further for the sake of brevity.

In another exemplary embodiment of the present invention, the fuse circuit 420 may receive a signal LS_MRS2 with a voltage level of the booster voltage VPP.

In another exemplary embodiment of the present invention, the voltage level of the booster voltage VPP may be greater than the voltage level of the external power voltage VCC.

In another exemplary embodiment of the present invention, the signal LS_MRS2 may be applied to the gate of the NMOS transistor N5.

In another exemplary embodiment of the present invention, the level shift circuit 310 may receive a first signal MRS2 with a first voltage level of power voltage VCC. The level shift circuit 310 may output a second signal LS_MRS2 with a second voltage level of the booster voltage VPP. Thus, the fuse circuit 420 may receive the second signal LS_MRS2, which may have a higher voltage level than the first signal MRS2.

In another exemplary embodiment of the present invention, referring to FIG. 4, the first signal MRS2 may have a high logic level (i.e. MRS2 is not connected to a ground terminal). When the first signal MRS2 has a high logic level, the transistors N10 and N12 may be turned on, while the transistors N11 and N13 may be turned off (i.e., may not pass a current present at a gate). Thereby, an inverted signal of the first signal MRS2 may be received by gates of the transistors N11 and N13. A transistor P11 may be turned one by the transistor N10, such that the level shift circuit 310 may output the second signal LS_MRS2, which may have a high logic level, to the fuse circuit 420. Thus, the voltage level of the second signal LS_MRS2 may have a voltage level of the booster voltage VPP.

In another exemplary embodiment of the present invention, referring to FIG. 4, the first signal MRS2 may have a low logic level (i.e. MRS2 is grounded and/or has a voltage level of zero). When the first signal MRS2 has a low logic level, the transistors N10 and N12 may be turned off, while the transistors N11 and N13 may be turned on. A transistor P10 may be turned on by the transistor N11. A gate voltage of a transistor P11 may rise to the booster voltage VPP. However, the transistor P11 may be turned off. Thus, the voltage level of the second signal LS_MRS2 may have a voltage level of zero.

Figure 5:
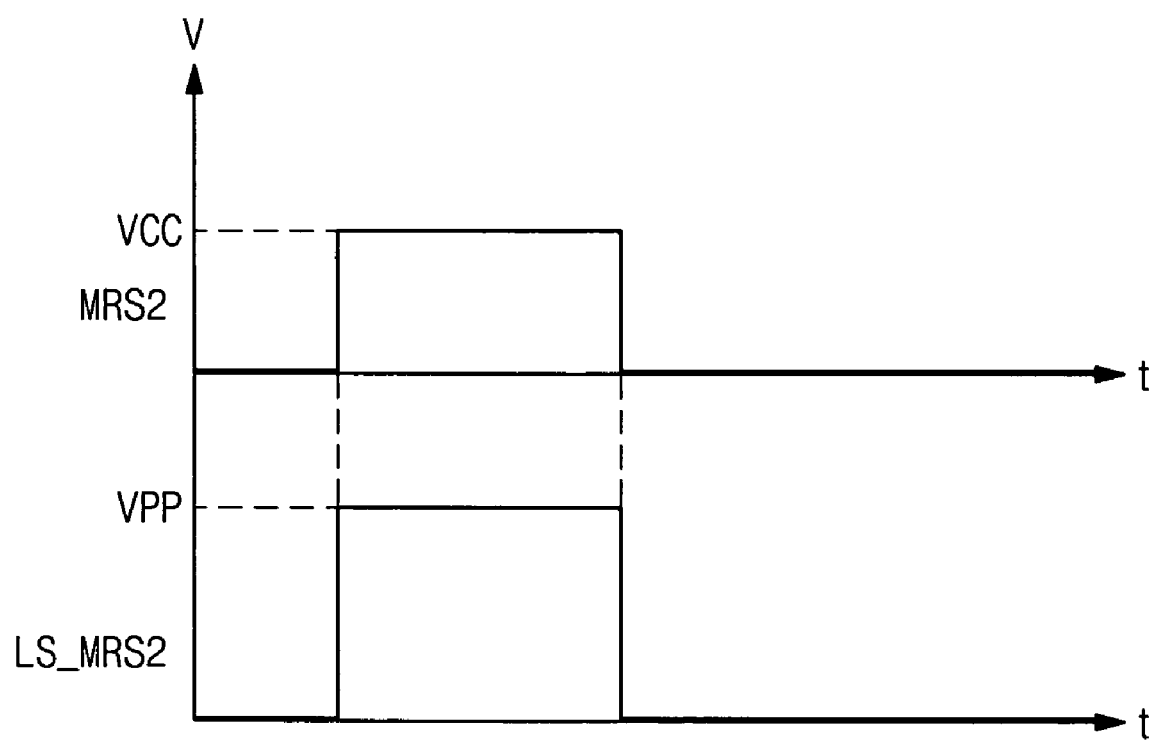
FIG. 5 illustrates a non-dimensional graph of voltage levels of the first signal MRS2 and the second signal LS_MRS2 according to an exemplary embodiment of the present invention.

FIG. 5 illustrates a non-dimensional graph of voltage levels of the first signal MRS2 and the second signal LS_MRS2 according to an exemplary embodiment of the present invention.

In another exemplary embodiment of the present invention, referring to FIG. 5, the first signal may begin with a voltage level of zero and may be increased to a voltage level of the power voltage VCC. Similarly, the voltage signal LS_MRS2 may begin with a voltage level of zero and may be increased to a voltage level of the booster voltage VPP.

In another exemplary embodiment of the present invention, when the second signal LS_MRS2 has a high logic level, the high logic level being equal to the booster voltage VPP, the NMOS transistor N5 of the fuse circuit 420 may be turned on. As the NMOS transistor N5 is turned on, current may flow through the NMOS transistor N5 to the fuse resistor R1. Thus, the booster voltage VPP, which may have a higher voltage level than the power voltage VCC, may be applied to the fuse resistor R1. Thereby, the increased applied voltage to the fuse resistor R1 may allow control over the fuse resistor R1 being burnt out.

Figure 6:
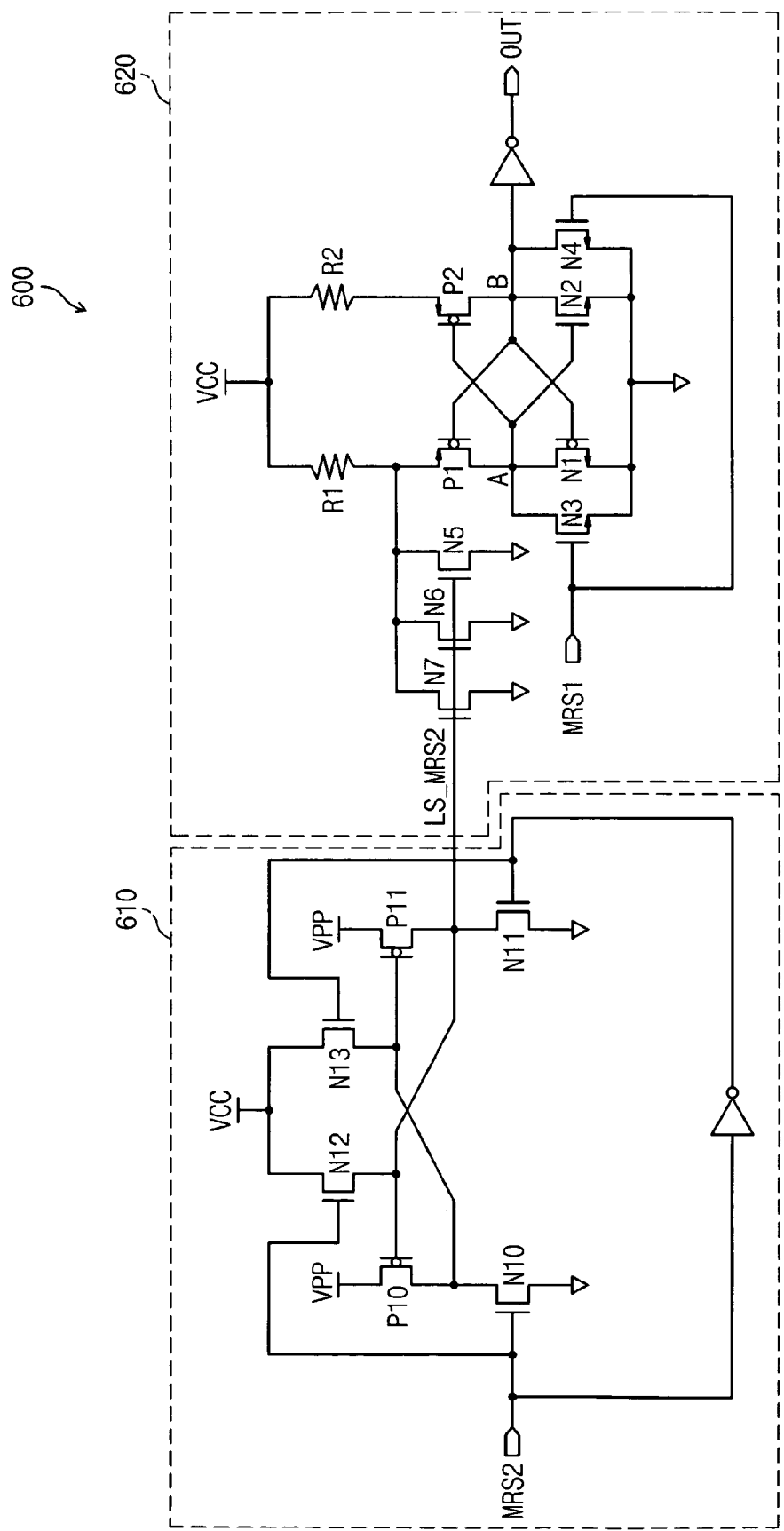
FIG. 6 illustrates a construction of the fuse circuit according to another exemplary embodiment of the present invention.

FIG. 6 illustrates a construction of a fuse arrangement 600 according to another exemplary embodiment of the present invention.

In another exemplary embodiment of the present invention, referring to FIG. 6, additional NMOS transistors N6 and N7 are included in the fuse arrangement 610 as compared with fuse circuit 420 of FIG. 4. The additional NMOS transistors N6 and N7 may allow additional current to flow to the fuse resistor R1 as compared to the single NMOS transistor N5. Thus, by increasing the amount of current flowing to the fuse resistor R1, control over the fuse resistor R1 being burnt out may be increased.

In another exemplary embodiment of the present invention, a voltage applied to a fuse resistor may be increased. Thereby, a current flowing through the fuse resistor may be increased. By increasing a current in a fuse resistor, a burn out in the fuse resistor may be controlled. Controlling a burn out in a fuse resistor may increase the accuracy of the E-fuse method, which may increase the yield of semiconductor devices.

The exemplary embodiments of the present invention being thus described, it will be obvious that the same may be varied in many ways. For example, FIG. 6 shows the second signal LS_MRS2 being received by the NMOS transistors N7, N6 and N5. However, it is understood that any number of NMOS transistors may be used in order to control a current flowing to the fuse resistor R1.

Further, various exemplary embodiments have been above-described including an NMOS and/or a PMOS transistor. However, it is understood that NMOS and/or PMOS transistors may be used exclusively and/or in any combination in any of the above-described exemplary embodiments.

Such variations are not to be regarded as departure from the spirit and scope of the exemplary embodiments of the present invention, and all such modifications as would be obvious to one skilled in the art are intended to be included within the scope of the following claims.

What is claimed is:

1. A fuse arrangement in a semiconductor device, comprising:
   a fuse resistor connected to a first voltage; and
   a transistor passing current to the fuse resistor, wherein a second voltage is applied to a gate of the transistor, the second voltage being greater than the first voltage.

2. The fuse arrangement of claim 1, wherein the second voltage has a highest DC voltage level of all internal voltages of the semiconductor device.

3. The fuse arrangement of claim 1, wherein the first voltage is increased to a power voltage.

4. The fuse arrangement of claim 1, further comprising:
   a level shift circuit receiving a first signal with a third voltage and outputting a second signal with a fourth, the fourth voltage being greater than the third voltage.

5. A fuse arrangement in a semiconductor device, comprising:
   a first fuse resistor having a first terminal connected to a first voltage and a second terminal connected to a first node;
   a second fuse resistor having a third terminal connected to the first voltage and a fourth terminal connected to a second node; and
   a transistor controlled by a first signal with a second voltage, the transistor passing current to the second terminal of the first fuse resistor based on the first signal, the second voltage being greater than the first voltage.

6. The fuse arrangement of claim 5, wherein voltages at the first and seconds nodes are based on a difference in the currents in the first and second fuse resistors.

7. The fuse arrangement of claim 6, wherein a voltage of the first node is set to a ground voltage.

8. The fuse arrangement of claim 6, wherein a voltage of the second node is set to a ground voltage.

9. The fuse arrangement of claim 6, wherein a voltage of the first node is set to the first voltage.

10. The fuse arrangement of claim 6, wherein a voltage of the second node is set to the first voltage.

11. The fuse arrangement of claim 5, wherein the second voltage has a highest DC voltage level of all internal voltages of the semiconductor device.

12. The fuse arrangement of claim 5, wherein the first voltage is increased to a power voltage.

13. The fuse arrangement of claim 5, further comprising additional transistors having a current path between the ground terminal and the second terminal of the first fuse resistor.

14. The fuse arrangement of claim 5, further comprising:
   a level shift circuit receiving a first signal with a third voltage and outputting a second signal with a fourth, the fourth being greater than the third voltage.

15. The fuse arrangement of claim 5, wherein the transistor is one of a plurality of transistors arranged to receive the first signal.

16. A method of burning out a fuse resistor of a fuse arrangement, comprising:
   converting a received first signal with a first voltage level to a second signal with a second voltage level, the second voltage level being greater than the first voltage level; and
   applying the second signal to the fuse arrangement.

17. The method of claim 16, wherein the second signal is applied to at least one NMOS transistor of the fuse arrangement.

18. A fuse arrangement and level shift circuit, comprising:

a first transistor receiving a first signal with a first voltage;

a second transistor receiving a second signal with a second voltage, the second voltage being greater than the first voltage;

a third transistor outputting a third signal with the second voltage; and a fuse circuit including a first fuse resistor, a second fuse resistor, where the first fuse resistor and the second fuse resistor have different resistances, and a fourth transistor for receiving the third signal with the second voltage.

19. A fuse arrangement and level shift circuit, comprising:

a first transistor receiving a first signal with a first voltage;

a second transistor receiving a second signal with a second voltage, the second voltage being greater than the first voltage;

a third transistor outputting a third signal with the second voltage; and a fuse circuit including a first fuse resistor, a second fuse resistor, where the first fuse resistor and the second fuse resistor have different resistances, and a plurality of transistors for receiving the third signal with the second voltage.

* * * * *